(12) United States Patent
Omata et al.

(10) Patent No.: US 6,463,577 B1
(45) Date of Patent: Oct. 8, 2002

(54) METHOD OF MANUFACTURING MASK USING INDEPENDENT PATTERN DATA FILES

(75) Inventors: Taketoshi Omata; Mitsuo Sakurai; Shuji Osada, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/564,685

(22) Filed: May 4, 2000

(30) Foreign Application Priority Data

Jul. 9, 1999 (JP) .......................................... 11-196636

(51) Int. Cl.[7] .................. G06F 17/50; G06F 19/00; G03F 1/02; G03F 9/00
(52) U.S. Cl. ..................... 716/21; 700/116; 700/120; 700/121; 700/96; 378/35; 430/5; 382/144
(58) Field of Search .................... 716/1–21; 700/96–97; 378/34–35; 430/4–5; 382/144

(56) References Cited

U.S. PATENT DOCUMENTS

| | | | | |
|---|---|---|---|---|
| 5,017,514 A | * | 5/1991 | Nishimoto | 438/14 |
| 5,429,896 A | * | 7/1995 | Hasegawa et al. | 430/5 |
| 5,723,236 A | * | 3/1998 | Inoue et al. | 430/5 |
| 5,851,703 A | * | 12/1998 | Hasegawa et al. | 430/5 |
| 6,221,541 B1 | * | 4/2001 | Ogusu et al. | 430/5 |

FOREIGN PATENT DOCUMENTS

| | | | | | |
|---|---|---|---|---|---|
| JP | 04040459 A | * | 2/1992 | | G03F/1/08 |
| JP | 04171449 A | * | 6/1992 | | G03F/1/08 |
| JP | 4-184342 | | 7/1992 | | G03F/1/08 |
| JP | 6-103335 | | 4/1994 | | G06F/15/60 |

* cited by examiner

Primary Examiner—Matthew Smith
Assistant Examiner—Phallaka Kik
(74) Attorney, Agent, or Firm—Staas & Halsey LLP (57) ABSTRACT

There are independently made data of a device pattern, an identification and scribe pattern including a scribe pattern surrounding the device pattern, identification patterns formed in a scribe region indicated by the scribe pattern and outer periphery of the scribe region, and an outer peripheral pattern formed outside the scribe region except the identification pattern. From the data, data for an exposure system or a mask inspection apparatus are produced. The outer peripheral pattern is divided into a plurality of patterns each is a unit of a exposure region.

6 Claims, 8 Drawing Sheets

DEVICE PATTERN

FIG.4(B)

ID AND SCRIBE PATTERN

FIG.4(C)

OUTER PERIPHERAL PATTERN

FIG.5(A)

DIVIDE INTO UNIT REGION OF EXPOSURE

FIG.5(B)

MASK

METHOD OF MANUFACTURING MASK USING INDEPENDENT PATTERN DATA FILES

BACKGROUND OF THE INVENTION

1. Field of the Invention

The present invention relates to a method of manufacturing a mask using independent pattern data files, the mask being such as an original mask or a reticle used for exposing an object to radiation such as light, ultraviolet and X-rays that selectively penetrates a pattern on the mask.

2. Description of the Related Art

Figure 8:
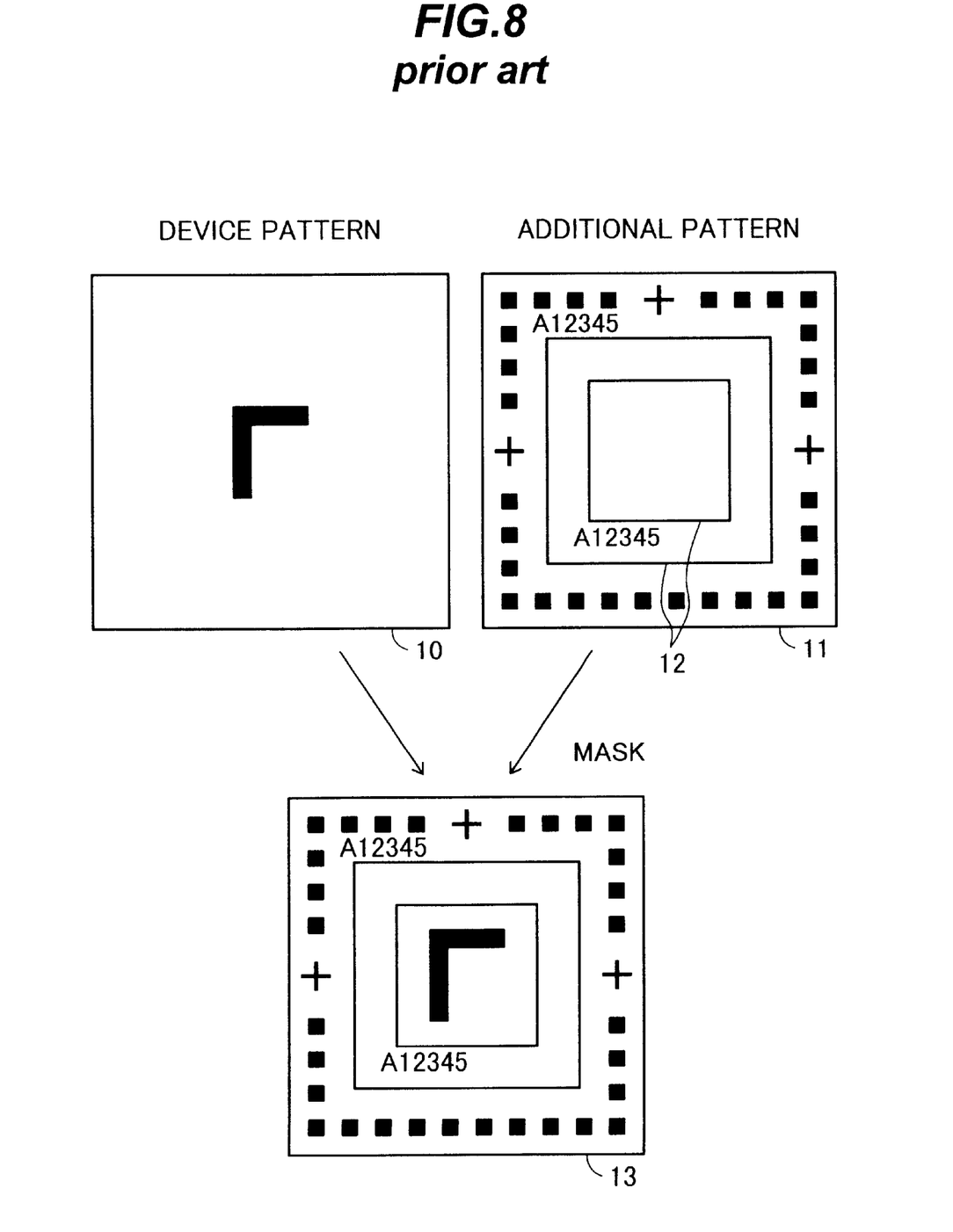
FIG. 8 is an illustration of patterns for explaining a prior art mask manufacturing method.

FIG. 8 is an illustration of a prior art mask manufacturing method. In FIG. 8, patterns are simplified. Pattern data have become tremendously voluminous with the progress of circuit element miniaturization and large-scale circuit. Therefore, various data compression techniques such as a repeated region cut-out method, a hierarchical structure and library data are used for CAD data and data for an exposure system. To effectively compress data, a device pattern 10 and an additional pattern 11 outside the device pattern 10 are separately made, and a mask is manufactured using the data of the both patterns.

Figure 7:
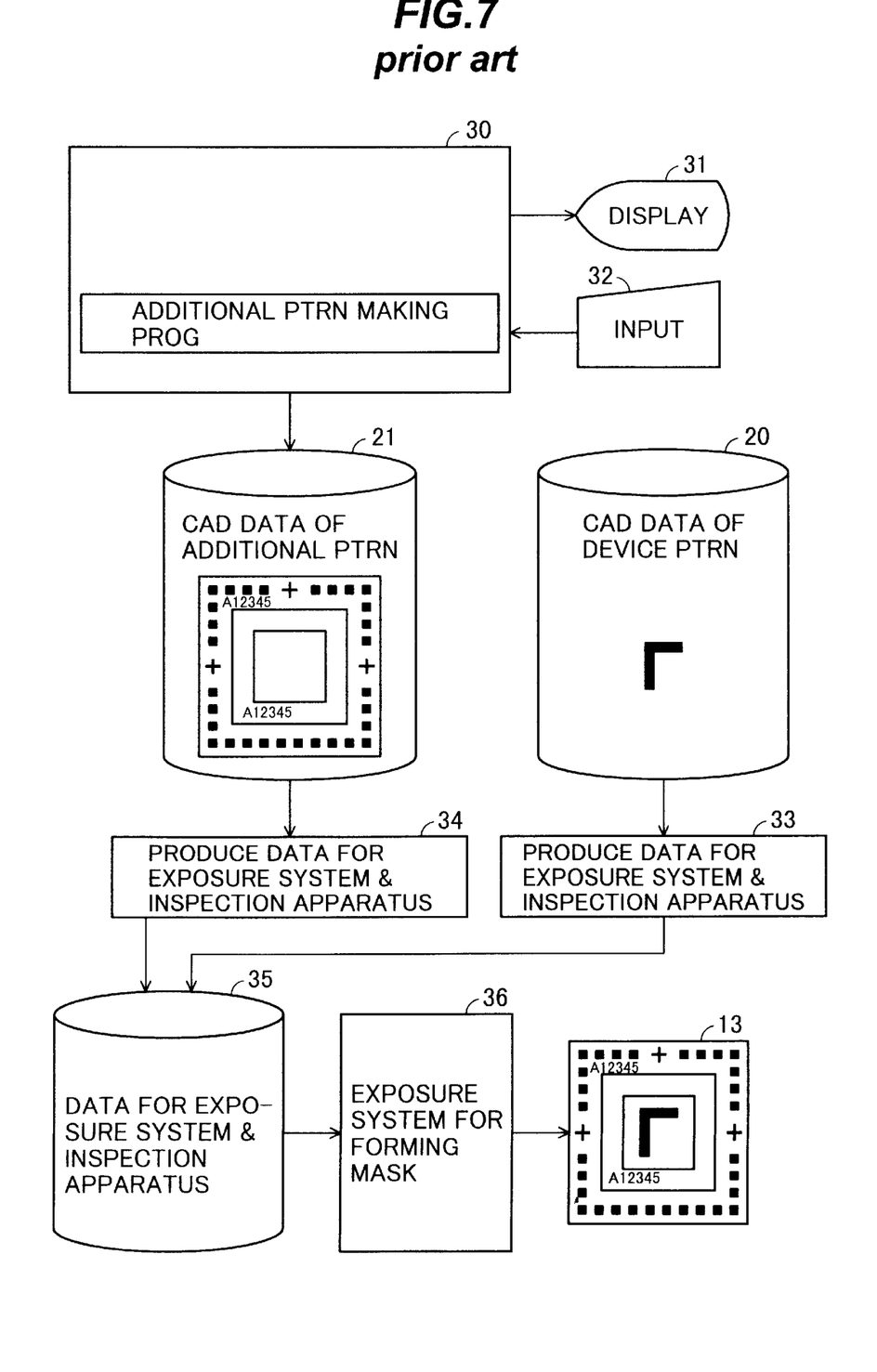
FIG. 7 is an illustration of part of a prior art mask pattern producing system.

FIG. 7 shows a schematic construction of part of a prior art mask pattern producing system.

Data of the device pattern 10 and the additional pattern 11 of FIG. 8 are stored in storage media 20 and 21, respectively. The data of the pattern 11 is produced using a CAD apparatus provided with a computer 30, a display unit 31 and an input unit 32, the latter two of which are connected to the computer 30. The data of the device pattern 10 is produced using a CAD apparatus not shown.

The data in the storage media 20 and 21 are converted to data for an exposure system by computers 33 and 34, respectively, and data for an inspection apparatus to inspect a manufactured mask 13 is also produced. These data are stored on a storage medium 35. The data for an exposure system are loaded into an exposure system 36, a photosensitive material coated on a blank mask is exposed to a radiation, and the exposed material is developed by a developing apparatus not shown to produce the mask 13.

Referring back to FIG. 8, in a scribe region indicated by a scribe pattern 12, there are formed a device identification pattern A12345 for enabling to confirm a used mask pattern by looking a patterned wafer, a pattern for measuring dimensions, a pattern for measuring a resolving power and an alignment pattern for layer-to-layer registration, the latter three patterns being not shown. Patterns not transferred on a wafer in the exposure are formed in a peripheral region outside the scribe pattern, the patterns not transferred including an inspection pattern, an accuracy measurement pattern, a device identification pattern A12345 and an alignment pattern for an apparatus onto which the mask 13 is mounted, for example, a stepper.

The device identification patterns A12345 correspond to the device pattern 10. Therefore, when the device pattern 10 is altered by a design change, the device identification patterns A12345 also change, whereby with respect to not only the device pattern 10 but also the additional pattern 11, the CAD data, the data for an exposure system and the data for an inspection apparatus have to be renewed using the system shown in FIG. 7, resulting in not only increasing the number of manufacturing steps but also reducing reliability.

Further, since the data for an exposure system has the device pattern 10 and the additional pattern 11 independently because of the data compression described above, in a case where the exposure system 36 is of a raster scan type, it is required that not only the device pattern 10 is exposed but also the additional pattern 11 is exposed all over the blank mask. Therefore, it takes a longer useless scanning time for exposure. That is, a region of no need to expose in the additional pattern 11 must be scanned, which reduces a throughput.

SUMMARY OF THE INVENTION

Accordingly, it is an object of the present invention to provide a mask manufacturing method which enable to manufacture a mask with a shorter process for data.

It is another object of the present invention to provide a mask manufacturing method which enable to shorten an exposure time by reducing an unnecessary region for raster scan.

In the present invention, there is provided a mask manufacturing method, comprising the steps of: making first data of a device pattern; making second data of an identification and scribe pattern including a scribe pattern surrounding the device pattern, and mask pattern identification patterns formed in a scribe region indicated by the scribe pattern and outside an outer periphery of the scribe region; making third data of an outer peripheral pattern formed outside the outer periphery of the scribe region except the outer one of the mask pattern identification patterns; and producing data for an exposure system or a mask inspection apparatus on the basis of the first to third data, wherein the first to third data are independently made from one another.

If the mask pattern identification pattern outside the outer periphery of the scribe region is included in the outer peripheral pattern, it is required that the identification and scribe pattern and the outer peripheral pattern are to be remade in company with alteration in the mask pattern identification pattern. However, according to the present invention, the mask pattern identification pattern outside the outer periphery of the scribe region is included in the identification and scribe pattern and therefore, only the identification and scribe pattern is required to be remade when the mask pattern identification pattern is altered, which not only makes a process shorter but also makes it possible for an existing pattern to be used with higher reliability than a newly formed one.

The mask pattern identification pattern is, for example, a pattern relating to a device manufacturing process, such as a pattern indicating a process technology or a process line, and in this case, even when the device pattern is altered in the design, the identification and scribe pattern is not required to remake if a change in the identification and scribe pattern does not occur.

Other aspects, objects, and the advantages of the present invention will become apparent from the following detailed description taken in connection with the accompanying drawings.

DESCRIPTION OF THE PREFERRED EMBODIMENTS

Referring now to the drawings, wherein like reference characters designate like or corresponding parts throughout several views, preferred embodiments of the present invention are described below.

First Embodiment

FIGS. 4(A) to 4(C) and FIGS. 5(A) and 5(B) are illustrations of patterns for explaining a mask manufacturing method of the first embodiment according to the present invention.

Figure 4A:
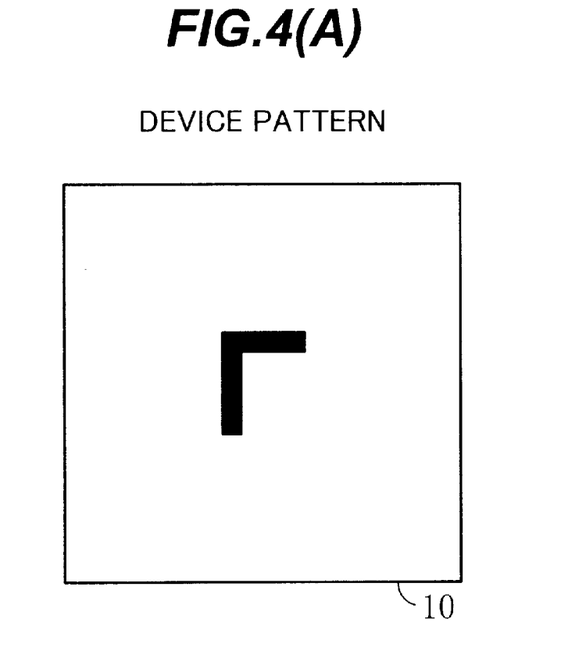
FIGS. 4(A) to 4(C) are illustrations of patterns for explaining a mask manufacturing method of the first embodiment according to the present invention.
Figure 4B:
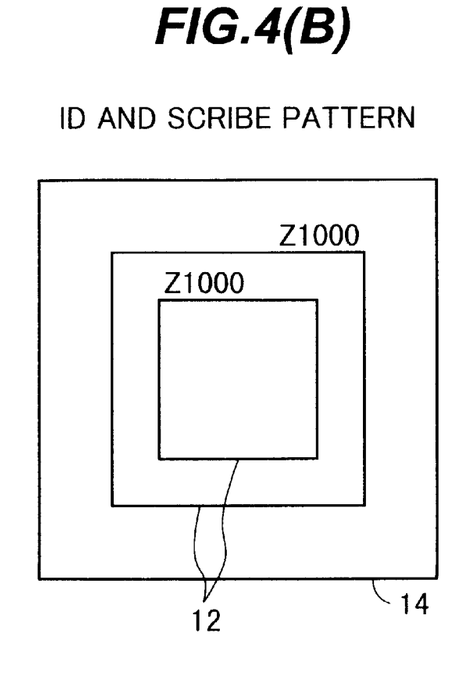
Figure 4C:
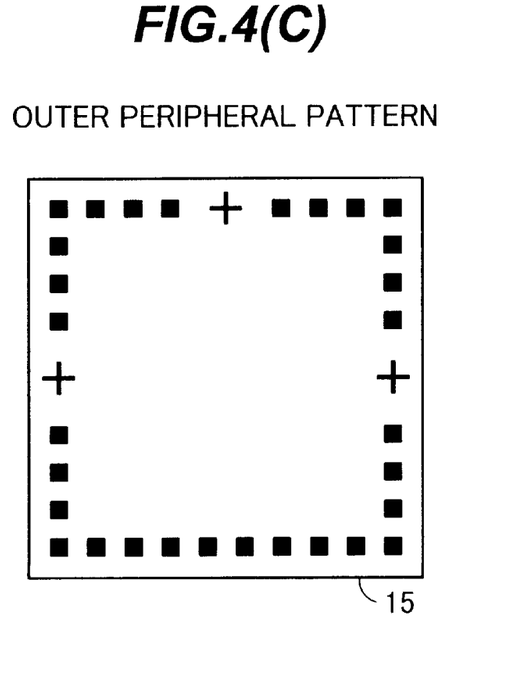

A mask pattern, as shown in FIG. 4(A) to 4(C), is divided into a device pattern 10, an identification and scribe pattern 14 outside the device pattern 10, and an outer peripheral pattern 15. These patterns are produced independently from one another.

The identification pattern and scribe pattern 14 comprises a scribe pattern 12 formed outside area of the device pattern 10, patterns formed in a scribe region and a process identification pattern Z1000 in the outer outside of the scribe region. The patterns formed in scribe region comprises a process identification pattern Z1000 and other patterns not shown, described above and including a dimension measurement pattern, a resolving power measurement pattern and an alignment pattern for layer-to-layer registration. Although the process identification patterns Z1000 correspond to the identification patterns A12345 of FIG. 8, the process identification patterns Z1000 indicate a process technology, a process line or the like, and even if the device pattern 10 is subjected to a design change, there is no need to change the identification patterns Z1000 and it is kept same after the design change. Therefore, it is not necessary to again produce the identification and scribe pattern 14 in a case where the device pattern has a design change.

An outer peripheral pattern 15 is ones formed in the outer outside of the scribe pattern 12 except the process identification pattern Z1000. The outer peripheral pattern 15 does not depend on the kind of the device pattern 10 but will be changed depending on a change of an exposure system or a change or addition of an inspecting apparatus.

If the process identification pattern Z1000 outside the scribe pattern 12 is included in the outer peripheral pattern 15, the identification and scribe pattern 14 and the outer peripheral pattern 15 are required to be simultaneously remade in company with a change in the process identification pattern Z1000. However, since the process identification pattern Z1000 is included in the identification and scribe pattern 14, only the identification and scribe pattern 14 is required to be remade when the process identification pattern Z1000 changes, which not only makes a process shorter but also makes it possible for an existing pattern to be used with higher reliability than a newly formed one.

Figure 5A:
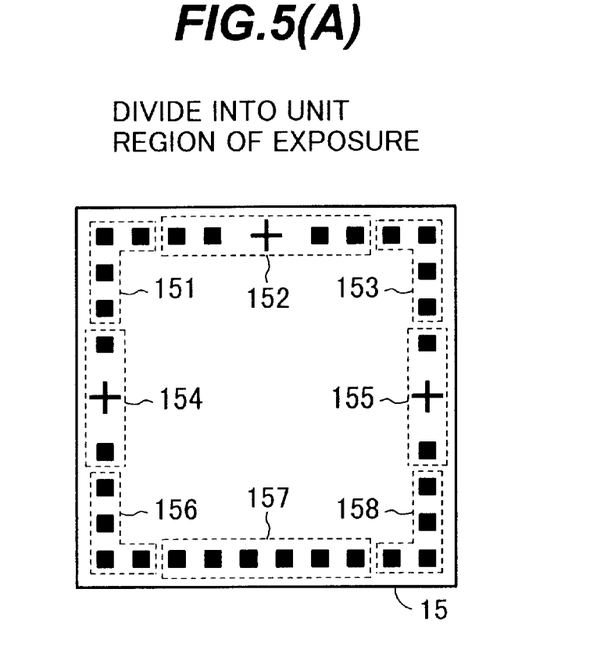
FIGS. 5(A) and 5(B) are illustrations of patterns for explaining the mask manufacturing method of the first embodiment according to the present invention.

The outer peripheral pattern 15, as shown in FIG. 5(A), is further divided into patterns 151 to 158 each of which is a unit of a raster scan region.

Figure 5B:
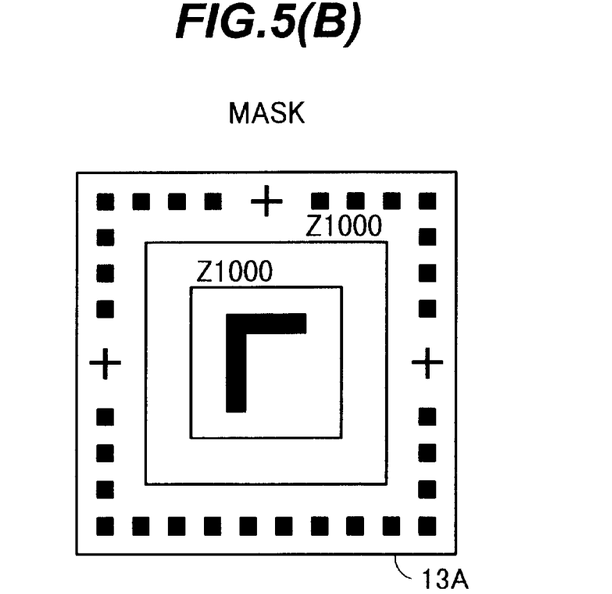

A mask 13A as shown in FIG. 5(B) is manufactured based on those device pattern 10, identification and scribe pattern 14 and outer peripheral pattern 15, which are independent from one another.

Figure 1:
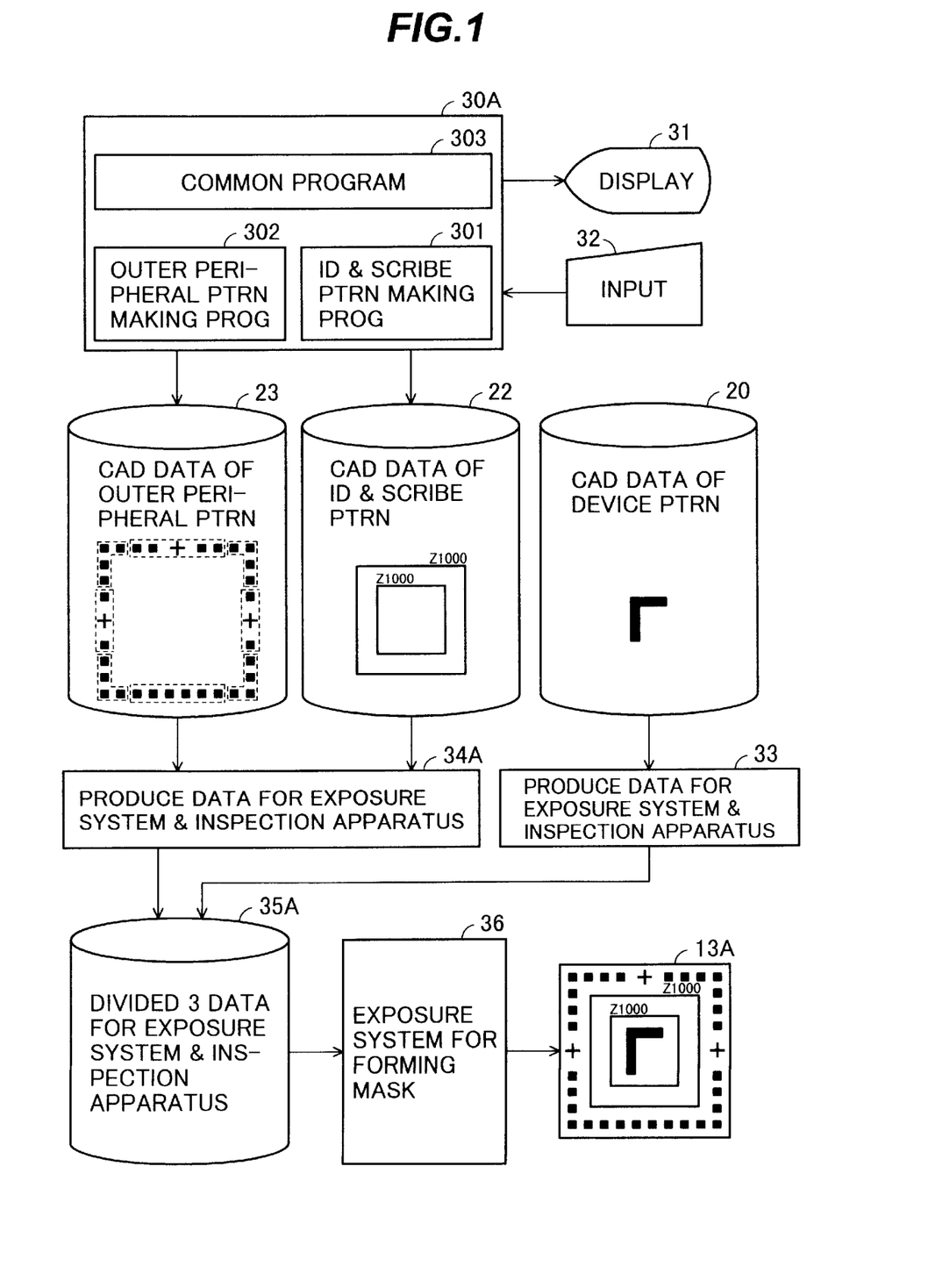
FIG. 1 is an illustration of part of a mask manufacturing system of the first embodiment according to the present invention.

FIG. 1 shows a schematic construction of part of a system for carrying out the above described mask manufacturing method.

Data of the device pattern 10 of FIG. 4, the identification and scribe pattern 14 of FIG. 4 and the outer peripheral pattern 15 of FIG. 5 are stored on storage media 20, 22 and 23, respectively.

The data on the storage media 22 and 23 are produced using a CAD apparatus including a computer 30A, a display unit 31 and an input unit 32, the latter two being connected to the computer 30A. That is, the data on the storage media 22 and 23 are produced by executing a program 301 of making the identification and scribe pattern and a program 302 of making the outer peripheral pattern, respectively, the programs being installed in the computer 30A. In the computer 30A, a program 303 common to the programs 301 and 302 is additionally installed, and in the common program 303, there are included a menu program for selectively executing one of the programs 301 and 302 and a retrieval program for existing pattern data. The data of the device pattern 10 is produced by means of the CAD apparatus not shown similarly to the case of FIG. 7.

The data on the storage medium 20 is converted to data for an exposure system by a computer 33 while the data on the storage media 22 and 23 are converted to data for an exposure system by a computer 34A, and data for an inspection apparatus to be used in inspecting the manufactured mask 13A is also produced. Thus produced data are stored on a storage medium 35A and among the data, the data for an exposure system are loaded into the exposure system 36. A photosensitive material coated on a blank mask is exposed to radiation by the exposure system 36, and developed by a developing apparatus not shown to obtain the mask 13A.

On the storage medium 35A, the data for an exposure system and the data for an inspection apparatus with respect to the device pattern 10, the identification and scribe pattern 14 and the outer peripheral. pattern 15 each are stored independently from one another, for example as separate data files. With such data structure, when any separate one of the data changes, the other data are not affected. Further, since the data file of an existing outer peripheral pattern can be combined with the data files of the device pattern and the identification and scribe pattern, the data for an exposure system and for an inspection apparatus are more easily produced.

Furthermore, in regard to the data of the outer peripheral pattern 15 for an exposure system, data of the patterns 151 to 158 shown in FIG. 5(A) are stored on the storage medium 35A independently from one another, for example, as separate files. Thereby in regard to the outer peripheral pattern 15, only each of the patterns 151 to 158 is raster scanned, regions unnecessary for raster scan are excluded in operation, resulting in reducing a useless scan time to increase a throughput.

Figure 2:
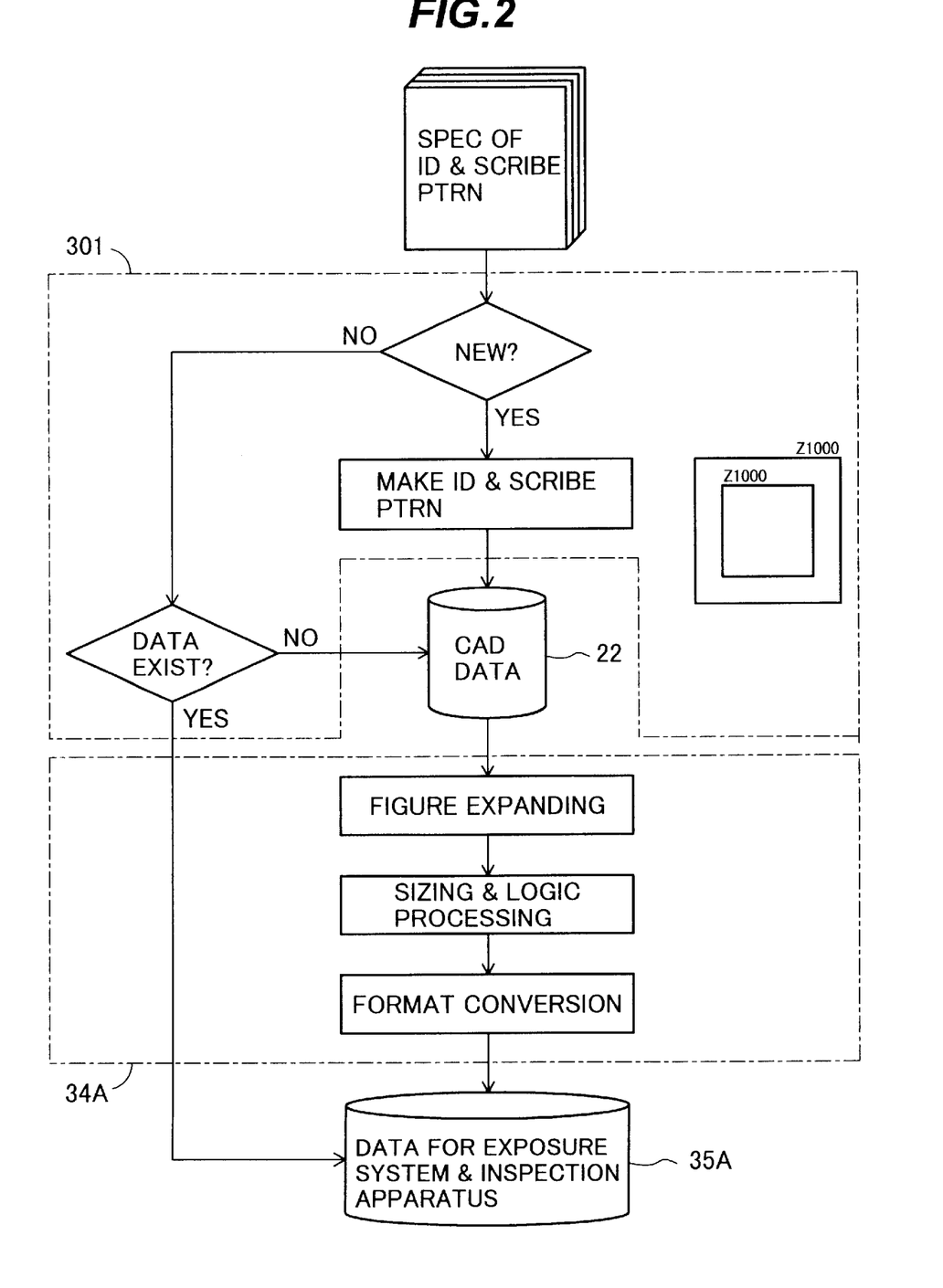
FIG. 2 is a general flow chart showing a procedure for producing CAD data, data for an exposure system and data for an inspection apparatus by means of the system of FIG. 1, with respect to identification and scribe patterns.

FIG. 2 is a general flow chart showing a procedure to produce the CAD data, the data for an exposure system and the data for an inspection apparatus with respect to the identification and scribe pattern 14 by means of the system of FIG. 1.

In processing on the program 301 for producing the identification and scribe pattern, only when an existing pattern 14 is unavailable, a new identification and scribe pattern 14 is produced. Even if the data of the existing identification and scribe pattern 14 is available, if data for an exposure system or an inspection apparatus data does not exist, the data for an exposure system or an inspection apparatus is produced by means of the computer 34A using CAD data.

In the computer 34A, as in a convention case, there are executed various processings such as figure expanding, sizing, logic processing and conversion to an exposure system format.

Figure 3:
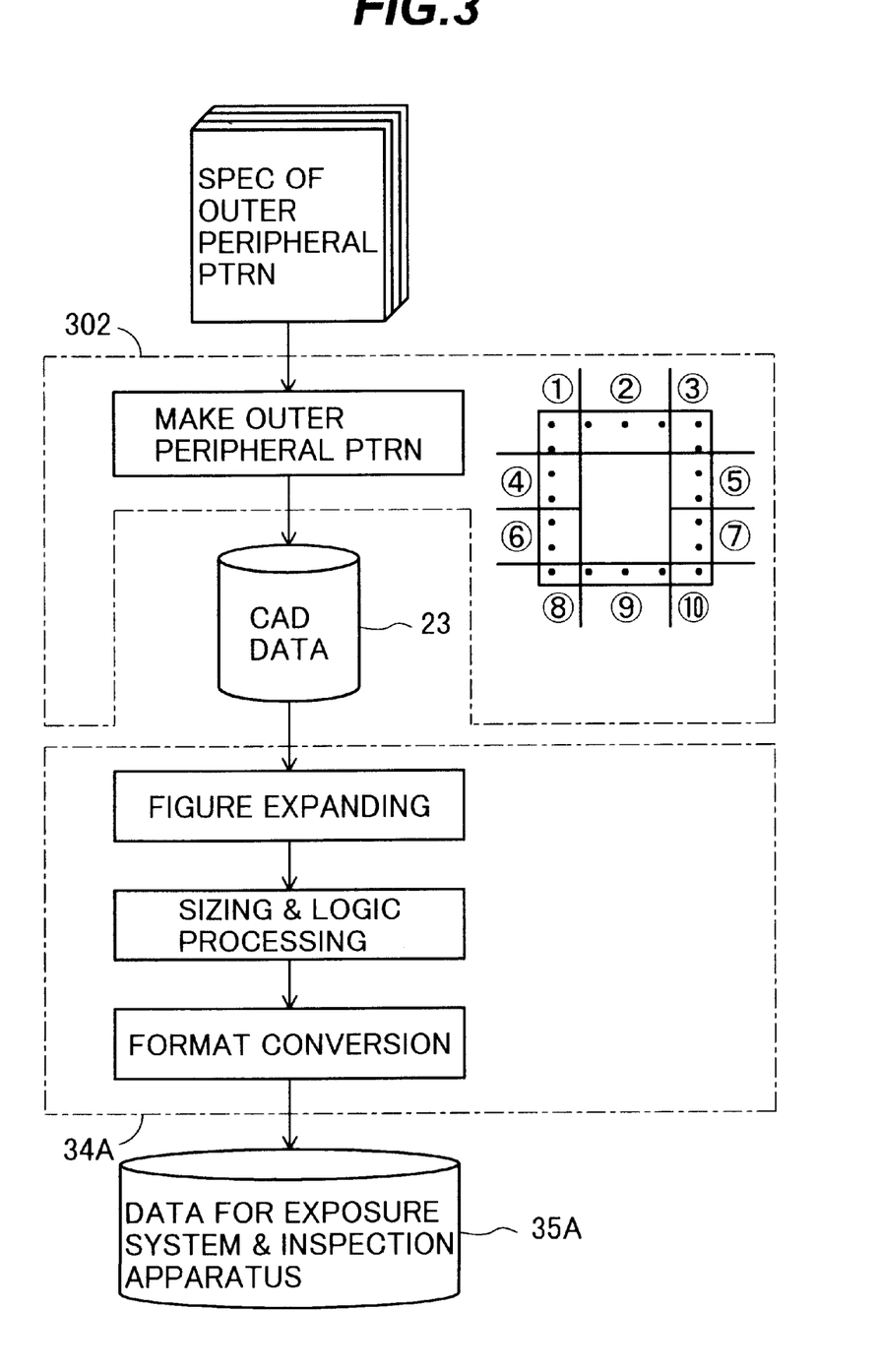
FIG. 3 is general flow chart showing a procedure for producing CAD data, data for an exposure system and data for an inspection apparatus by means of the system of FIG. 1, with respect to an outer peripheral pattern.

FIG. 3 is a general flow chart showing a procedure for producing the CAD data, the data for an exposure system and the data for an inspection apparatus with respect to the outer peripheral pattern 15 by means of the system of FIG. 1. FIG. 3 shows a case where the outer peripheral pattern 15 is divided into 10 units of exposure regions ① to ⑩.

Second Embodiment

Figure 6:
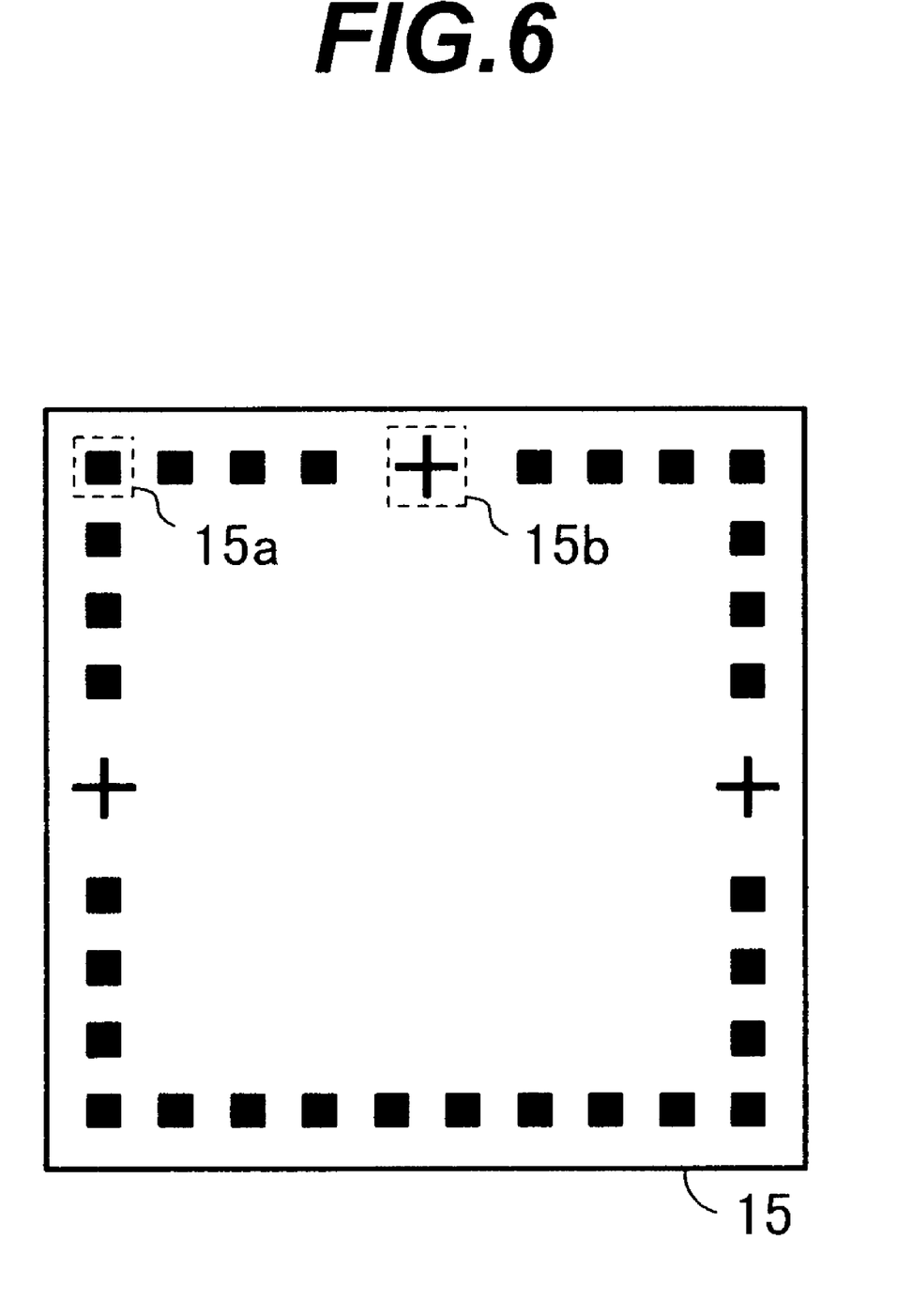
FIG. 6 is an illustration of a division method for an outer peripheral pattern, of the second embodiment according to the present invention.

FIG. 6 shows a division method of the outer peripheral pattern 15 of the second embodiment according to the present invention:

Fundamental patterns 15a and 15b differing from each other are cut out from the outer peripheral pattern 15. The data of the outer peripheral pattern 15 are composed of the fundamental patterns 15a and 15b, and the directions, the numbers and pitches of repetition of each pattern arrangement. Thereby, an amount of the data of the outer peripheral pattern 15 on the storage medium is reduced.

Further, since each of the fundamental patterns 15a and 15b is a unit region of raster scan by the exposure system 36, more of regions unnecessary for raster scan are excluded in operation than in the first embodiment, resulting in reducing more of a useless scan time to increase a throughput.

Although preferred embodiments of the present invention has been described, it is to be understood that the invention is not limited thereto and that various changes and modifications may be made without departing from the spirit and scope of the invention.

For example, the storage media 22 and 23 may be the same one and further, the computers 33 and 34A may be the same one as well.

What is claimed is:

1. A mask manufacturing method, comprising:
   making first data of a device pattern;
   making second data of an identification and scribe pattern including a scribe pattern surrounding said device pattern, and mask pattern identification patterns formed in a scribe region indicated by said scribe pattern and outside an outer periphery of said region;
   making third data of an outer peripheral pattern formed outside said outer periphery of said scribe region except an outer one of said mask pattern identification patterns; and
   producing data for an exposure system or a mask inspection apparatus on the basis of said first to third data, wherein said first to third data are independently made from one another.

2. A mask manufacturing method according to claim 1, wherein said exposure system is of a raster scan type and said outer peripheral pattern is divided into a plurality of patterns each of which is a unit of an exposure region.

3. An apparatus for producing mask pattern data, said apparatus comprising a computer in which a program is installed, said program being for making:
   first data of a device pattern;
   second data of an identification and scribe pattern including a scribe pattern surrounding said device pattern, and mask pattern identification patterns formed in a scribe region indicated by said scribe pattern and outside an outer periphery of said scribe region; and
   third data of an outer peripheral pattern formed outside said outer periphery of said scribe region except an outer one of said mask pattern identification patterns,
   wherein said first to third data are independently made from one another.

4. A storage medium on which a program is stored, said program being for making:
   first data of device pattern;
   second data of an identification and scribe pattern including a scribe pattern surrounding said device pattern, and mask pattern identification patterns formed in a scribe region indicated by said scribe pattern and outside an outer periphery of said scribe region; and
   third data of an outer peripheral pattern formed outside said outer periphery of said scribe region except an outer one of said mask pattern identification patterns,
   wherein said first to third data are independently made from one another.

5. A storage medium on which data is stored, said data being for operating an exposure system, said data comprising:
   first data of a device pattern;
   second data of an identification and scribe pattern including a scribe pattern surrounding said device pattern, and mask pattern identification patterns formed in a scribe region indicated by said scribe pattern and outside an outer periphery of said scribe region; and
   third data of an outer peripheral pattern formed outside said outer periphery of said scribe region except an outer one of said mask pattern identification patterns,
   wherein said first to third data are stored independently from one another in said storage medium.

6. A machine-readable medium that provides instructions, which, when executed by a machine, cause the machine to perform operations comprising:
   making first data of a device pattern;
   making second data of an identification and scribe pattern including a scribe pattern surrounding said device pattern, and mask pattern identification patterns formed in a scribe region indicated by said scribe pattern and outside an outer periphery of said region;
   making third data of an outer peripheral pattern formed outside said outer periphery of said scribe region except an outer one of said mask pattern identification patterns; and
   producing data for an exposure system or a mask inspection apparatus on the basis of said first to third data, wherein said first to third data are independently made from one another.

* * * * *